(12) United States Patent
Takeuchi et al.

(10) Patent No.: US 12,178,023 B2
(45) Date of Patent: Dec. 24, 2024

(54) POWER CONVERSION DEVICE

(71) Applicant: DENSO CORPORATION, Kariya (JP)

(72) Inventors: Kazuya Takeuchi, Kariya (JP); Kenji Shibata, Kariya (JP); Yoshihito Takahashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 281 days.

(21) Appl. No.: 17/510,771

(22) Filed: Oct. 26, 2021

(65) Prior Publication Data

US 2022/0046831 A1 Feb. 10, 2022

Related U.S. Application Data

(63) Continuation of application No. PCT/JP2020/015764, filed on Apr. 8, 2020.

(30) Foreign Application Priority Data

Apr. 26, 2019 (JP) ................... 2019-086339

(51) Int. Cl.
*H05K 7/20* (2006.01)
*H01L 23/40* (2006.01)
*H01L 23/473* (2006.01)
*H02M 7/537* (2006.01)

(52) U.S. Cl.
CPC ......... *H05K 7/20927* (2013.01); *H01L 23/40* (2013.01); *H01L 23/473* (2013.01); *H02M 7/537* (2013.01)

(58) Field of Classification Search
CPC .. H05K 13/046; H05K 7/20927; H01L 23/40; H01L 23/473; H01L 23/4012; H02M 1/007; H02M 1/008; H02M 1/088; H02M 3/158; H02M 7/537

See application file for complete search history.

(56) References Cited

U.S. PATENT DOCUMENTS

| 5,797,602 A * | 8/1998 | Less ................ F16J 15/348 277/372 |
| 2004/0124289 A1* | 7/2004 | Yamamoto .......... F16K 15/205 239/DIG. 19 |
| 2007/0039717 A1* | 2/2007 | Inagaki ............... H01L 23/473 165/172 |

(Continued)

FOREIGN PATENT DOCUMENTS

| JP | 2014009761 A | 1/2014 |
| JP | 2015053763 A | 3/2015 |

OTHER PUBLICATIONS

Jul. 14, 2020 International Search Report issued in International Application No. PCT/JP2020/015764.

*Primary Examiner* — Adam B Dravininkas
(74) *Attorney, Agent, or Firm* — Oliff PLC

(57) ABSTRACT

A power conversion device includes a semiconductor module, a cooling device, a case, which accommodates the semiconductor module and the cooling device, a connector, which is connected to an inlet pipe, which is a refrigerant flow pipe of the cooling device, and a sealing member, which seals between the inlet pipe and the connector. The connector includes a pipe portion, which communicates with the inlet pipe, and a flange portion, which is secured to the case. The pipe portion and the flange portion are joined to each other with the pipe portion located in an insertion hole of the flange portion.

10 Claims, 16 Drawing Sheets

(56) References Cited

U.S. PATENT DOCUMENTS

| | | | |
|---|---|---|---|
| 2010/0212622 A1* | 8/2010 | Cleeves | F01L 5/06 |
| | | | 123/188.5 |
| 2014/0367964 A1 | 12/2014 | Kobayashi et al. | |
| 2015/0152987 A1* | 6/2015 | Ishikawa | H05K 7/20927 |
| | | | 285/350 |
| 2016/0374235 A1* | 12/2016 | Sakamoto | H05K 7/20927 |
| 2017/0335705 A1* | 11/2017 | Tyler, Jr. | F01D 11/005 |
| 2019/0264984 A1* | 8/2019 | Takagi | H05K 7/20272 |
| 2020/0308972 A1* | 10/2020 | Tyler | F01D 11/005 |

\* cited by examiner

POWER CONVERSION DEVICE

CROSS-REFERENCE TO RELATED APPLICATION

This application is the U.S. bypass application of International Application No. PCT/JP2020/015764 filed on Apr. 8, 2020 which designated the U.S. and claims priority to Japanese Patent Application No. 2019-086339 filed on Apr. 26, 2019, the contents of both of which are incorporated herein by reference.

TECHNICAL FIELD

The present disclosure relates to a power conversion device.

BACKGROUND

Conventionally, a power conversion device that converts DC power from a battery to AC power is mounted on, for example, electric vehicles and hybrid vehicles to drive a motor for moving a vehicle. JP 2015-53763 A discloses a power conversion device that includes semiconductor modules each of which including a switching element, a cooling device for cooling the semiconductor modules, a case that accommodates the semiconductor modules and the cooling device, and a connector provided on each of a refrigerant inlet pipe and a refrigerant discharge pipe, which are refrigerant flow pipes of the cooling device.

SUMMARY

One aspect of the present disclosure provides a power conversion device that includes a semiconductor module, a cooling device, a case, a connector, and a sealing member. The semiconductor module includes a switching element. The cooling device includes a heat exchanger capable of exchanging heat with the semiconductor module, an inlet pipe that introduces a refrigerant to the heat exchanger, and a discharge pipe that discharges the refrigerant from the heat exchanger. The case accommodates the semiconductor module and the cooling device. The connector is connected to a refrigerant flow pipe, which is at least one of the inlet pipe and the discharge pipe of the cooling device on an outside of the case. The sealing member seals between the refrigerant flow pipe and the connector.

The connector includes a pipe portion, which communicates with the refrigerant flow pipe, and a flange portion, which is secured to the case. The pipe portion and the flange portion are joined to each other with the pipe portion located in an insertion hole of the flange portion.

The connector includes an axial direction restricting section that restricts the pipe portion and the flange portion from relatively moving in an axial direction of the pipe portion. The axial direction restricting section includes at least one projection that projects radially outward on the pipe portion, and the at least one projection is located adjacent to an opening edge portion of the insertion hole of the flange portion.

Another aspect of the present disclosure provides a power conversion device that includes a semiconductor module, a cooling device, a case, a connector, and a sealing member. The semiconductor module includes a switching element. The cooling device includes a heat exchanger capable of exchanging heat with the semiconductor module, an inlet pipe that introduces a refrigerant to the heat exchanger, and a discharge pipe that discharges the refrigerant from the heat exchanger. The case accommodates the semiconductor module and the cooling device. The connector is connected to a refrigerant flow pipe, which is at least one of the inlet pipe and the discharge pipe of the cooling device on an outside of the case. The sealing member seals between the refrigerant flow pipe and the connector.

The connector includes a pipe portion, which communicates with the refrigerant flow pipe, and a flange portion, which is secured to the case. The pipe portion and the flange portion are joined to each other with the pipe portion located in an insertion hole of the flange portion.

The pipe portion and the flange portion of the connector are both made of a metal material and are joined to each other by a deformation process.

BRIEF DESCRIPTION OF THE DRAWINGS

The above features of the present disclosure will be made clearer by the following detailed description, given referring to the appended drawings. In the accompanying drawings.

DETAILED DESCRIPTION OF THE PREFERRED EMBODIMENTS

Figure 1:
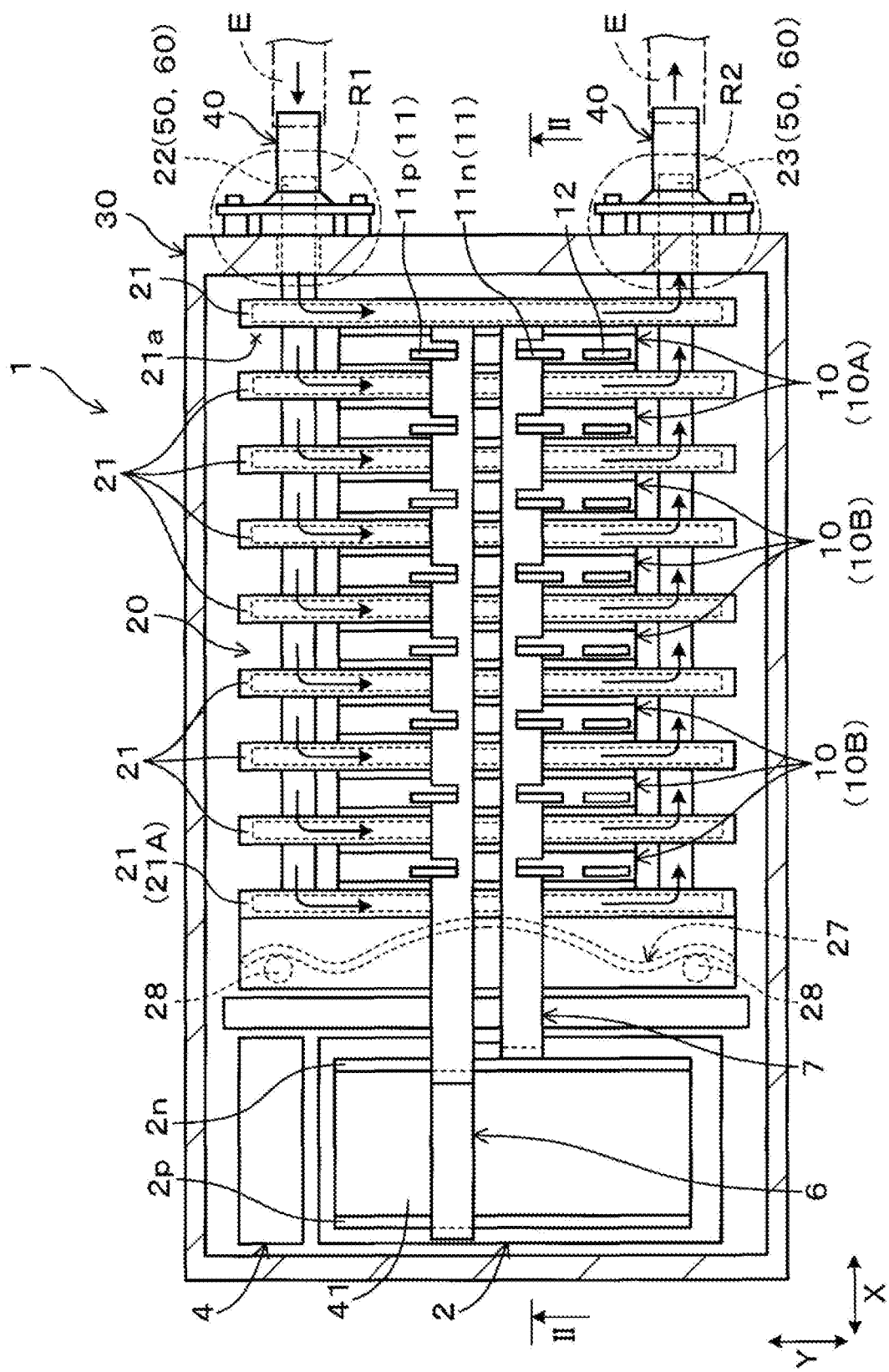
FIG. 1 shows a cross-sectional view of a power conversion device according to a first embodiment.

In the power conversion device disclosed in JP 2015-53763 A, each connector is located between one of the refrigerant flow pipes of the cooling device and an external pipe. Each connector includes a tubular portion, which communicates with the associated refrigerant flow pipe, and a flange portion, which projects radially outward from the tubular portion, and is configured as an integral part formed of a plastic material.

According to the above-mentioned power conversion device, when the shape of the external pipe connected to the connector is changed, the shape of the connector needs to be changed accordingly. At this time, when the connector is an integral part, various kinds of connectors corresponding to the shapes of the available external pipes need to be prepared to improve the versatility in connecting to external pipes having a variety of shapes. In this case, since the change in the shape of the connector affects the entire connector, the costs required for producing the connector may be undesirably increased.

The present disclosure is intended to provide a power conversion device that includes a highly versatile and low-cost connector located between a refrigerant flow pipe of a cooling device for semiconductor modules and an external pipe.

One aspect of the present disclosure provides a power conversion device that includes a semiconductor module, a cooling device, a case, a connector, and a sealing member.

The semiconductor module includes a switching element. The cooling device includes a heat exchanger capable of exchanging heat with the semiconductor module, an inlet pipe that introduces a refrigerant to the heat exchanger, and a discharge pipe that discharges the refrigerant from the heat exchanger. The case accommodates the semiconductor module and the cooling device. The connector is connected to a refrigerant flow pipe, which is at least one of the inlet pipe and the discharge pipe of the cooling device on an outside of the case. The sealing member seals between the refrigerant flow pipe and the connector.

The connector includes a pipe portion, which communicates with the refrigerant flow pipe, and a flange portion, which is secured to the case. The pipe portion and the flange portion are joined to each other with the pipe portion located in an insertion hole of the flange portion.

The connector includes an axial direction restricting section that restricts the pipe portion and the flange portion from relatively moving in an axial direction of the pipe portion. The axial direction restricting section includes at least one projection that projects radially outward on the pipe portion, and the at least one projection is located adjacent to an opening edge portion of the insertion hole of the flange portion.

Another aspect of the present disclosure provides a power conversion device that includes a semiconductor module, a cooling device, a case, a connector, and a sealing member.

The semiconductor module includes a switching element. The cooling device includes a heat exchanger capable of exchanging heat with the semiconductor module, an inlet pipe that introduces a refrigerant to the heat exchanger, and a discharge pipe that discharges the refrigerant from the heat exchanger. The case accommodates the semiconductor module and the cooling device. The connector is connected to a refrigerant flow pipe, which is at least one of the inlet pipe and the discharge pipe of the cooling device on an outside of the case. The sealing member seals between the refrigerant flow pipe and the connector.

The connector includes a pipe portion, which communicates with the refrigerant flow pipe, and a flange portion, which is secured to the case. The pipe portion and the flange portion are joined to each other with the pipe portion located in an insertion hole of the flange portion.

The pipe portion and the flange portion of the connector are both made of a metal material and are joined to each other by a deformation process.

In the above-mentioned power conversion device, the heat exchanger of the cooling device is capable of exchanging heat with the semiconductor modules each including the switching element. The connector is connected to the refrigerant flow pipe, which is at least one of the inlet pipe and the discharge pipe of the cooling device, on the outside of the case. The connector is located between the refrigerant flow pipe of the cooling device and the external pipe. When the connector is connected to the refrigerant flow pipe, the sealing member seals between the refrigerant flow pipe and the connector.

The connector is configured in such a manner that the pipe portion and the flange portion are joined to each other with the pipe portion, which is a separate member from the flange portion, located in the insertion hole of the flange portion. Thus, while the flange portion may be used in common by external pipes having different shapes, the versatility in connecting to the external pipes of a variety of shapes is improved by changing only the shape of the pipe portion, which is a separate member from the flange portion. At this time, since only the shape of the pipe portion needs to be changed, for example, the number of molds for forming the flange portion does not need to be increased, which minimizes the costs required for producing the connector.

As described above, the above aspect provides a power conversion device that includes a highly versatile and low-cost connector located between a refrigerant flow pipe of a cooling device for semiconductor modules and an external pipe.

Hereinafter, a power conversion device according to an embodiment will be described with reference to the drawings. The power conversion device is mounted on a vehicle such as an electric vehicle and a hybrid vehicle and is configured as a vehicle-mounted power conversion device that converts power between DC power and AC power.

In the present description, unless otherwise specified in particular, a first direction in which cooling pipes of a cooling device that are located in parallel to each other are stacked is indicated by an arrow X, a second direction in which the cooling pipes extend is indicated by an arrow Y, and a third direction orthogonal to both the first direction and the second direction is indicated by an arrow Z.

First Embodiment

Figure 2:
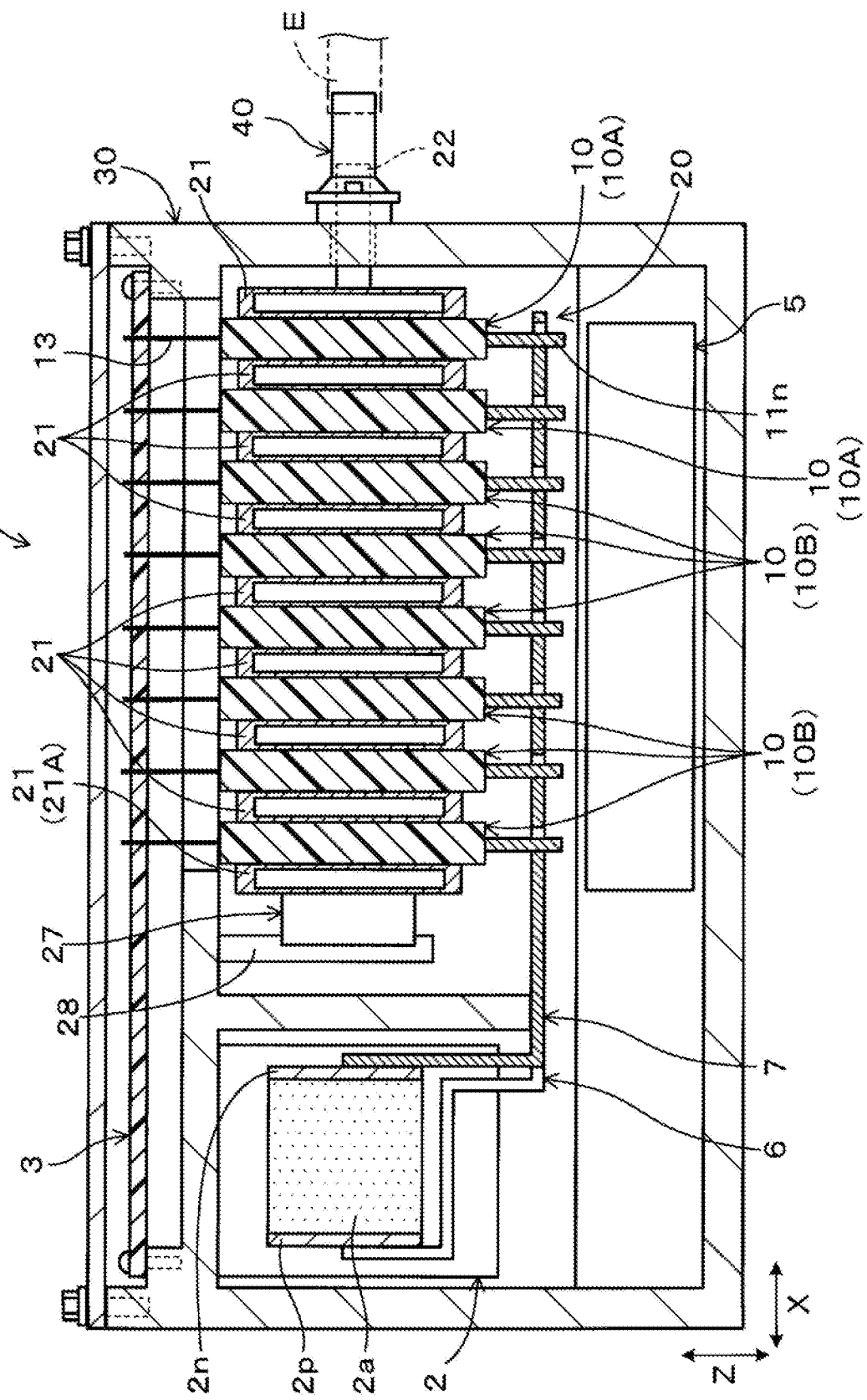
FIG. 2 shows a cross-sectional view taken along line II-II of FIG. 1 as viewed in the direction of arrows.

As shown in FIGS. 1 and 2, a power conversion device 1 according to a first embodiment generally includes semiconductor modules 10, a cooling device 20, and a case 30.

The case 30 is a metal housing that accommodates the semiconductor modules 10, the cooling device 20, and other components. The components include a capacitor 2, a control substrate 3, a reactor 4, and a DC-DC converter 5.

The capacitor 2 includes a capacitor element 2a and a pair of metal electrodes 2p and 2n. The metal electrode 2p is electrically connected to a positive terminal 11p of switching elements 11 included in each semiconductor module 10 through a metal bus bar 6. The metal electrode 2n is electrically connected to a negative terminal 11n of the switching elements 11 of each semiconductor module 10 through a metal bus bar 7.

The cooling device 20 functions to cool the semiconductor modules 10 using a cooling medium (hereinafter, simply referred to as a refrigerant). The cooling device 20 is a stack-type cooling device and includes cooling pipes 21, which are stacked together with the semiconductor modules 10. The cooling pipes 21 are stacked in the first direction X and are located parallel to each other with spaces 21a provided in between. The semiconductor modules 10 are located in the spaces 21a, respectively.

The cooling pipes 21 extend in the second direction Y, and the cross-sectional shape in the first direction X (the cross-sectional shape on the plane specified by the first direction X and the third direction Z) is rectangular. The cooling pipes 21 are connected in parallel to an inlet pipe 22 and a discharge pipe 23. The cooling pipes 21 are configured as a heat exchanger that is capable of exchanging heat with the semiconductor modules 10. For this reason, the cooling pipes 21 are preferably formed of a material having high thermal conductivity, for example, a metal material such as aluminum.

The cooling pipes 21 include an outer cooling pipe 21A, which is pressed rightward of FIG. 1 by a compression leaf spring 27. The leaf spring 27 is supported by support pins 28 secured to the case 30. Since the leaf spring 27 presses the outer cooling pipe 21A, the cooling pipes 21 and the semiconductor modules 10 abut against each other under pressure in the first direction X.

Note that, the present embodiment exemplifies a case in which nine cooling pipes 21 are stacked in the first direction X, and the semiconductor modules 10 are respectively located in eight spaces 21a formed by the nine cooling pipes 21. However, the number of the semiconductor modules 10 and the number of the cooling pipes 21 are not limited to this and can be changed as required.

The inlet pipe 22 and the discharge pipe 23 both extend in the first direction X, which is the stacking direction of the cooling pipes 21, and are secured to the case 30 at a first region R1 and a second region R2 with connectors 40. External pipes E such as rubber hoses are connected to the connectors 40. The inlet pipe 22 and the discharge pipe 23 are preferably made of the same material as the cooling pipes 21 and are preferably made of, for example, a metal material such as aluminum.

The inlet pipe 22 is for introducing a refrigerant into the cooling pipes 21, and the discharge pipe 23 is for discharging the refrigerant from the cooling pipes 21. Thus, the refrigerant introduced through the inlet pipe 22 flows in parallel through the cooling pipes 21 in the second direction. When flowing through the refrigerant flow passage in each cooling pipe 21, the refrigerant cools the semiconductor modules 10 located on both sides of the cooling pipe 21 in the first direction X and is discharged through the discharge pipe 23.

A typical refrigerant includes water in which ethylene glycol-based antifreeze is mixed, a natural refrigerant such as water and ammonia, a fluorocarbon-based refrigerant such as Fluorinert, a Freon-based refrigerant such as HCFC123 and HFC134a, an alcohol-based refrigerant such as methanol and alcohol, and a ketone-based refrigerant such as acetone.

Figure 3:
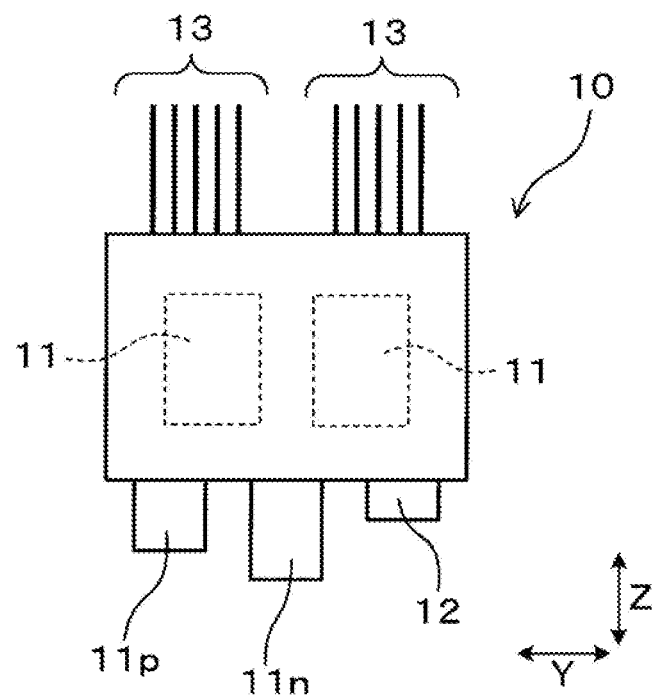
FIG. 3 shows a front view of a semiconductor module in FIG. 1.

As shown in FIG. 3, the semiconductor modules 10 are 2-in-1 modules each including two switching elements 11 in the module body. The semiconductor modules 10 each include a pair of electrode terminals, which are the positive terminal 11p and the negative terminal 11n, an output terminal 12, which is connected to a positive electrode of an auxiliary battery, which will be described below (an auxiliary battery B2 in FIG. 4), and control terminals 13, which are connected to a control circuit on the control substrate 3 that drives the switching elements 11.

Figure 4:
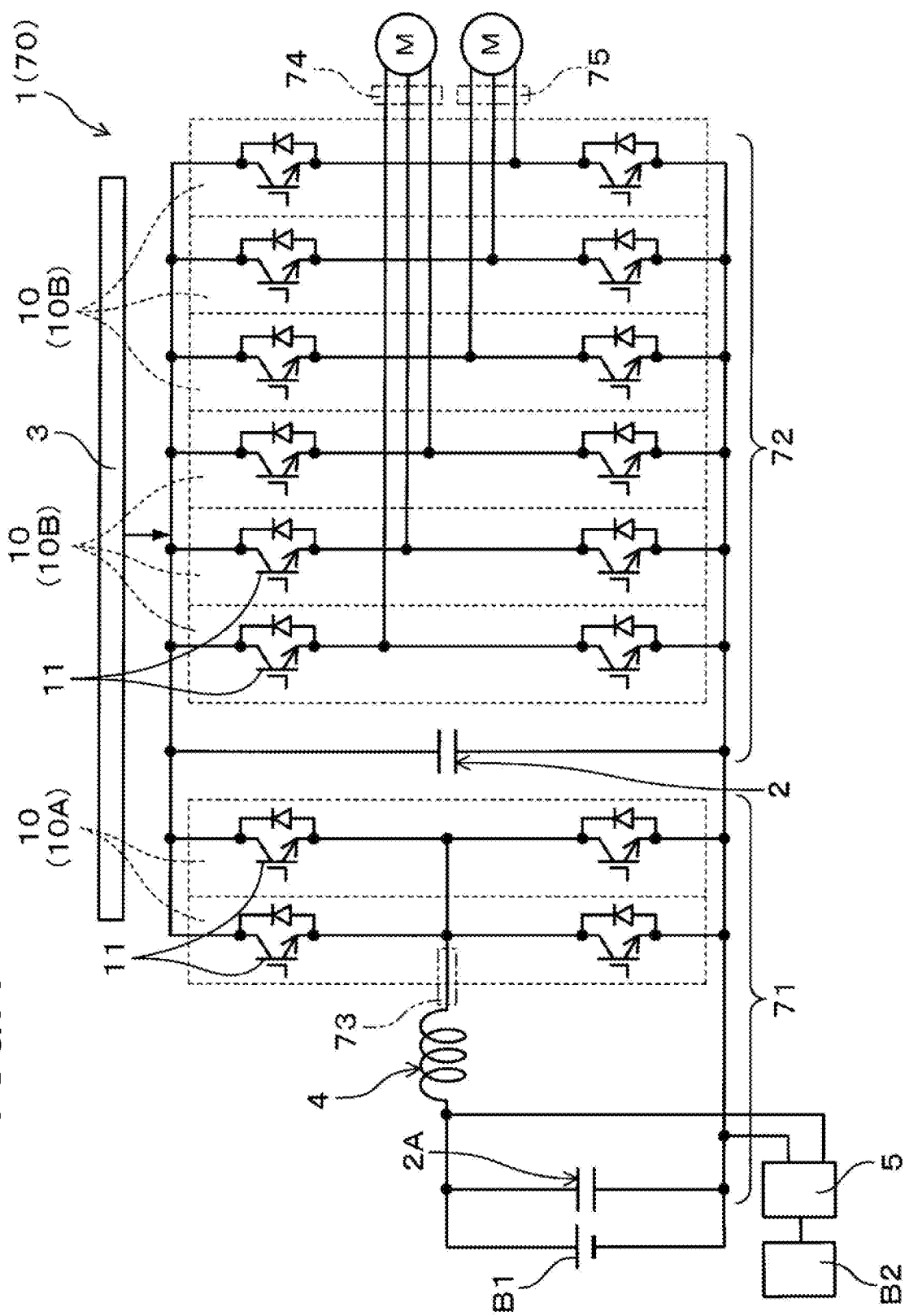
FIG. 4 shows an inverter circuit diagram of the power conversion device according to the first embodiment.

As shown in FIG. 4, the power conversion device 1 includes an inverter circuit 70, which is a power conversion circuit that converts DC power supplied from a DC power supply B1 to AC power. In the inverter circuit 70, the semiconductor modules 10 are electrically connected to the control substrate 3, and the control substrate 3 controls the switching operation (ON/OFF operation) of the semiconductor modules 10. The control substrate 3 is secured to the case 30 as shown in FIG. 2.

In the present embodiment, a capacitor 2A, the reactor 4, and two semiconductor modules 10A constitute a booster 71 of the inverter circuit 70, which is the power conversion circuit. The booster 71 functions to boost the voltage of the DC power supply B1 by the switching operation (ON/OFF operation) of the semiconductor modules 10A.

The capacitor 2A is for removing a noise current included in the current supplied from the DC power supply B1 and is also referred to as a filter capacitor. Like the capacitor 2 described above, the capacitor 2A is configured as a capacitor including a film capacitor element. The reactor 4 is a passive element that uses an inductor.

In the meantime, the capacitor 2 and six semiconductor modules 10B configure a converting section 72 of the inverter circuit 70, which is the power conversion circuit. The converting section 72 functions to convert the DC power that has been boosted by the booster 71 to AC power by the switching operation (ON/OFF operation) of the semiconductor modules 10B.

The capacitor 2 is for smoothing the DC power boosted by the booster 71 and is also referred to as a smoothing capacitor. The AC power obtained by the converting section 72 drives three-phase alternating motors M for moving the vehicle.

The DC-DC converter 5 is connected to the DC power supply B1. The DC-DC converter 5 is used to lower the voltage of the DC power supply B1 and charge the auxiliary battery B2 that has a lower voltage than the DC power supply B1. The auxiliary battery B2 is used as a power supply for a variety of devices mounted on a vehicle.

The current flowing through the booster 71 is detected by a current sensor 73. The current flowing between the converting section 72 and the three-phase alternating motors M is detected by current sensors 74 and 75. The current sensors 73, 74, and 75 are electrically connected to the control substrate 3, and detection information by the current sensors 73, 74, and 75 is transmitted to the control substrate 3.

Figure 5:
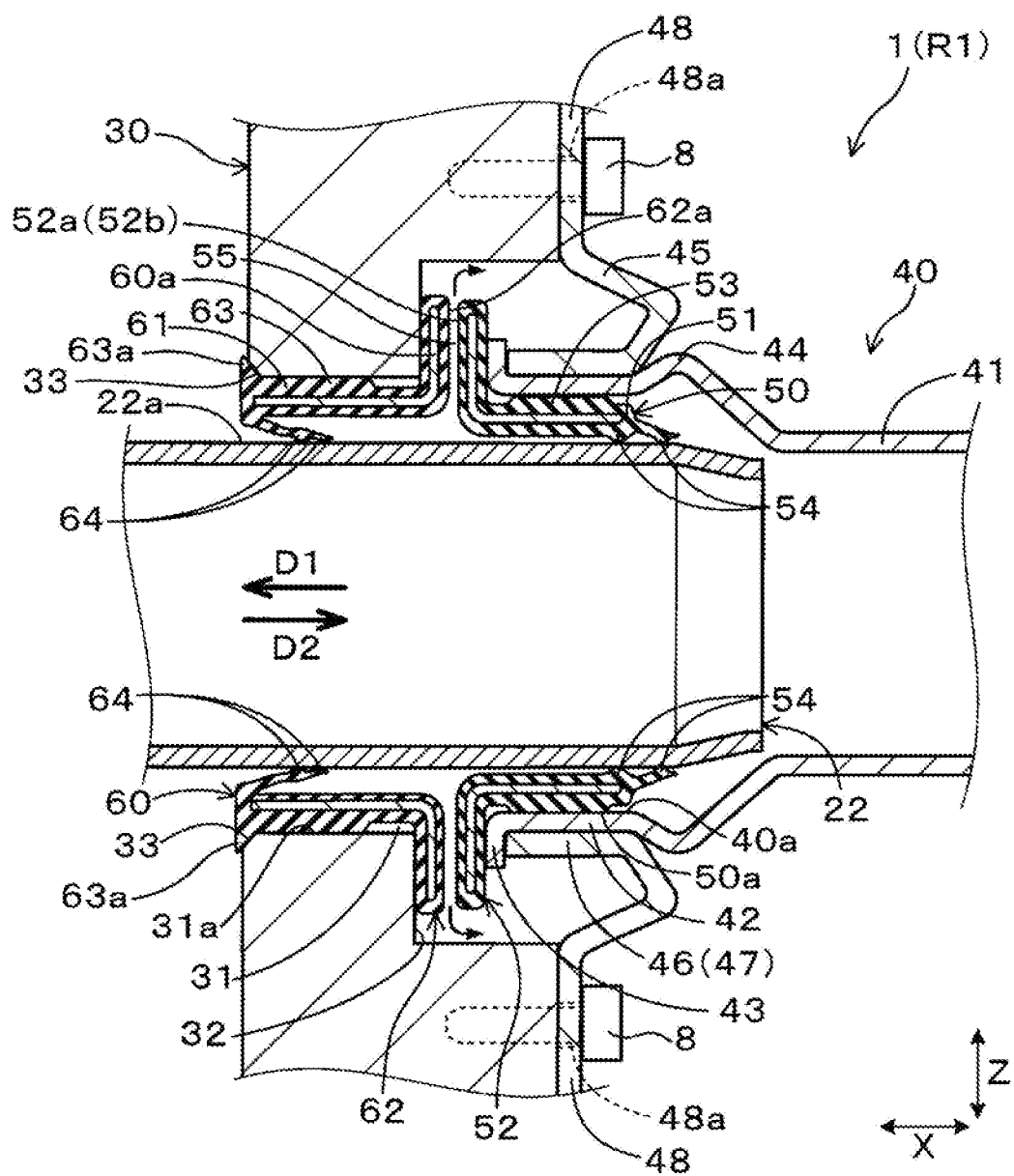
FIG. 5 shows a cross-sectional view of a first region in FIG. 1.

As shown in FIG. 5, the power conversion device 1 includes the connectors 40, a first sealing member 50, and a second sealing member 60.

The inlet pipe 22, which is the refrigerant flow pipe, is inserted in a through-hole 31 formed through the case 30 so that the distal end section projects outside the case 30. The inlet pipe 22 is configured to be connected to one of the connectors 40 on the outside of the case 30 (refer to the first region R1 in FIG. 1). The first sealing member 50 seals between the inlet pipe 22 and the associated connector 40.

The connector 40 includes a tubular pipe portion 41, which communicates with the inlet pipe 22, and a flange portion 45, which is secured to the case 30 with fastening members 8.

The pipe portion 41 and the flange portion 45 are both formed of a metal material and are joined as one unit. Thus, the connector 40 is made of a metal material. The metal material of the connector 40 may typically be a stainless-steel material that has high corrosion resistance against the refrigerant.

The pipe portion 41 includes an inner tube 42, which has an inner diameter greater than the outer diameter of the inlet pipe 22, a disk-like projection 43 that projects radially outward from the inner tube 42, and a projection 44 that projects radially outward from the position on the opposite side of the inner tube 42 from the projection 43. The distal end section of the inlet pipe 22 is inserted inside the inner tube 42 of the pipe portion 41. One of the external pipes E (refer to FIG. 1) that is to communicate with the inlet pipe 22 is connected to the pipe portion 41. Thus, the pipe portion 41 virtually forms the connector 40.

The flange portion 45 includes a cylindrical outer tube 46, which is located on the outer periphery of the inner tube 42 of the pipe portion 41, and a disk-like flange portion 48, which extends radially outward from the outer tube 46. The space in the outer tube 46 forms an insertion hole 47 in which the inner tube 42 of the pipe portion 41 is inserted. Thus, the outer tube 46 is an opening edge portion of the insertion hole 47. The flange portion 48 includes mounting holes 48a in which the shafts of the fastening members 8 are inserted.

The outer tube 46 is sandwiched between the projection 43 and the projection 44, which are both formed on the pipe portion 41 adjacent to the outer tube 46 and project radially outward. In this state, the projection 43 and the projection 44 configure an axial direction restricting section, which restricts the pipe portion 41 and the flange portion 45 from relatively moving in the first direction X, which is the axial direction of the pipe portion 41.

The first sealing member 50 includes a connector-side tubular portion, which is a tubular portion 51, a disk-like flange portion 52, which extends radially outward from the tubular portion 51, a first watertight seal projection, which is a projection 53, and second watertight seal projections, which are projections 54. Hereinafter, the first sealing member 50 is simply referred to as the "sealing member 50".

The sealing member 50 includes a metal core material 50a, which forms a frame portion, and a plastic portion, which covers around the core material 50a with a plastic material. The projections 53 and 54 of the sealing member 50 are formed of the plastic portion around the core material 50a.

The sealing member 50 is inserted in the connector 40 in an insertion direction D2 and, in this state, the sealing member 50 is mounted on the case 30 together with the connector 40.

The tubular portion 51 of the sealing member 50 is located between an inner peripheral surface 40a of the connector 40 and an outer peripheral surface 22a of the inlet pipe 22. The flange portion 52 is located such that the projection 43 of the pipe portion 41 is sandwiched between the flange portion 52 and the flange portion 45 in the first direction X.

The projection 53 is formed as an annular projection that projects radially outward in an annular shape from the tubular portion 51 toward the inner peripheral surface 40a of the connector 40. The cross-sectional shape of the projection 53 on the plane determined by the first direction X and the third direction Z is substantially a trapezoid the width of which in the first direction X gradually decreases radially outward. Thus, the projection 53 forms a trapezoidal lip seal structure. The projection 53 abuts against the inner peripheral surface 40a of the connector 40. At this time, the projection 53 is compressed by the inner peripheral surface 40a of the connector 40 and elastically deforms, so that watertight sealing performance is exerted.

The projections 54 are formed as annular projections that project radially inward in an annular shape from the tubular portion 51 toward the outer peripheral surface 22a of the inlet pipe 22. The projections 54 are generally provided on an arm portion that extends rightward in FIG. 5 from the section corresponding to the right distal end section of the core material 50a. The cross-sectional shape of the arm portion on the plane determined by the first direction X and the third direction Z is shaped such that two annular projections 54 are spaced apart in the first direction X. Thus, the two projections 54 form a double lip seal structure.

When the two projections 54 abut against the outer peripheral surface 22a of the inlet pipe 22, the projections 54 are compressed by the outer peripheral surface 22a of the inlet pipe 22 and elastically deform, so that watertight sealing performance is exerted. Since the flexible plastic arm portion is long, the arm portion elastically deforms in accordance with the eccentricity of the inlet pipe 22, so that the projections 54 can maintain high watertight sealing performance. The projections 54 shaped as above have a good ability to deform in accordance with the eccentricity of the inlet pipe 22.

The projection 53 and the projections 54 are all shaped as if the projecting portion is extended annularly in the circumferential direction and extend on the plane determined by the second direction Y and the third direction Z.

In the present embodiment, one projection 53 is located on the outer surface of the tubular portion 51, and two projections 54 are located on the inner surface of the tubular portion 51 with a gap in the first direction X.

The number, position, and shape of the projection 53 and the projections 54 are not limited to those mentioned above and can be changed as required. That is, the number of the projections 53 may be the same as the number of the projections 54, or the number of the projections 53 may differ from the number of the projections 54. The cross-sectional shape of the projection 53 may be a rectangle the width of which in the first direction X is generally constant. To improve the sealing performance, the number of the projections 53 and 54 is preferably increased.

The second sealing member 60 is provided at a position closer to the cooling pipes 21 of the cooling device 20 than the sealing member 50 in the first direction X to seal between the through-hole 31 of the case 30 and the inlet pipe 22. The second sealing member 60 is configured as a separate member from the sealing member 50.

The second sealing member 60 includes a case-side tubular portion, which is a tubular portion 61, a disk-like flange portion 62, which extends radially outward from the tubular portion 61, a first airtight seal projection, which is a projection 63, and second airtight seal projections, which are projections 64. Hereinafter, the second sealing member 60 is simply referred to as the "sealing member 60".

The sealing member 60 includes, like the sealing member 50, a metal core material 60a, which forms a frame portion, and a plastic portion, which covers around the core material 60a with a plastic material. The projections 63 and 64 of the sealing member 60 are formed of the plastic portion around the core material 60a.

The sealing member 60 is mounted on the case 30 by being inserted in the case 30 in an insertion direction D1. The tubular portion 61 of the sealing member 60 is located between an inner peripheral surface 31a of the through-hole 31 of the case 30 and the outer peripheral surface 22a of the inlet pipe 22. The flange portion 62 is located to abut against an end surface 32 of the case 30 in the first direction X from the outside.

Note that, in the present embodiment, the insertion direction D1 of the sealing member 60 corresponds to a removing direction D1 of the sealing member 50. Additionally, a removing direction D2 of the sealing member 60 corresponds to the insertion direction D2 of the sealing member 50.

Given the circumstances, the flange portion 62 of the sealing member 60 is provided to overlap the flange portion 52 of the sealing member 50 in the removing direction D1 of the sealing member 50. In this case, the dimension of the flange portion 62 is preferably set to overlap the flange portion 52 of the sealing member 50 in the removing direction D1. Thus, the flange portion 62 serves as a first sealing member restricting section, which restricts the movement of the sealing member 50 in the removing direction D1. As a result, the sealing member 50 becomes unlikely to fall out, and the watertight sealing performance of the sealing member 50 is maintained.

The projection 63 is formed as an annular projection that projects radially outward in an annular shape from the tubular portion 61 toward the inner peripheral surface 31a of the through-hole 31 of the case 30. The cross-sectional shape of the projection 63 on the plane determined by the first direction X and the third direction Z is substantially a trapezoid the width of which in the first direction X gradually decreases radially outward. Thus, the projection 63 forms a trapezoidal lip seal structure. The projection 63 abuts against the inner peripheral surface 31a of the through-hole 31. At this time, the projection 63 is compressed by the inner peripheral surface 31a of the through-hole 31 and elastically deforms, so that airtight sealing performance is exerted.

Additionally, when the sealing member 60 is inserted in the case 30, part of the projection 63 protrudes radially outward, forming a hook 63a. The hook 63a is caught on a locking portion 33 of the case 30 and functions to prevent the sealing member 60 from falling out. The locking portion 33 of the case 30 is chamfered where the corner is cut at an angle. The locking portion 33 may be provided annularly in the circumferential direction or may be provided partially in the circumferential direction.

The projections 64 are formed as annular projections that project radially inward in an annular shape from the tubular portion 61 toward the outer peripheral surface 22a of the inlet pipe 22. The projections 64 are generally provided on an arm portion that extends rightward in FIG. 5 from the section corresponding to the left distal end section of the core material 60a. The cross-sectional shape of the arm portion on the plane determined by the first direction X and the third direction Z is shaped such that two annular projections 64 are spaced apart in the first direction X. Thus, the two projections 64 form a double lip seal structure.

When the two projections 64 abut against the outer peripheral surface 22a of the inlet pipe 22, the projections 64 are compressed by the outer peripheral surface 22a of the inlet pipe 22 and elastically deform, so that airtight sealing performance is exerted. Since the flexible plastic arm portion is long, the arm portion elastically deforms in accordance with the eccentricity of the inlet pipe 22, so that the projections 64 can maintain high airtight sealing performance. The projections 64 shaped as above have a good ability to deform in accordance with the eccentricity of the inlet pipe 22.

The projection 63 and the projections 64 are all shaped as if the projecting portion is extended annularly in the circumferential direction and extend on the plane determined by the second direction Y and the third direction Z.

In the present embodiment, one projection 63 is located on the outer surface of the tubular portion 61, and two projections 64 are located on the inner surface of the tubular portion 61 with a gap in the first direction X. Additionally, the two projections 63 overlap the two projections 64 in the third direction Z, respectively.

The number, position, and shape of the projection 63 and the projections 64 are not limited to those mentioned above and can be changed as required. That is, the number of the projection 63 may be the same as the number of the projection 64, or the number of the projection 63 may differ from the number of the projection 64. The cross-sectional shape of the projection 63 may be a rectangle the width of which in the first direction X is generally constant. To improve the sealing performance, the number of the projections 63 and 64 is preferably increased.

When the connector 40 is formed of a material that has higher corrosion resistance against the refrigerant than the inlet pipe 22, to enhance the sealing performance of the inlet pipe 22 having low corrosion resistance, the number of the projections 54 may be greater than the number of the projection 53 on the sealing member 50, or the number of the projections 64 may be greater than the number of the projection 63 on the sealing member 60.

A gap 55 in the first direction X is formed between a first opposing surface 52a of the flange portion 52 of the sealing member 50 and a second opposing surface 62a of the flange portion 62 of the sealing member 60. The first opposing surface 52a and the second opposing surface 62a face each other in the first direction X. Thus, the gap 55 forms a refrigerant discharging passage that connects the space between the sealing member 50 and the outer peripheral surface 22a of the inlet pipe 22 to the outside of the case 30. The gap 55 functions to discharge the refrigerant to the outside of the case 30 when the refrigerant flows into the space on the outer peripheral surface 22a of the inlet pipe 22. The gap 55 prevents the refrigerant from flowing to the inside of the case 30.

Figure 6:
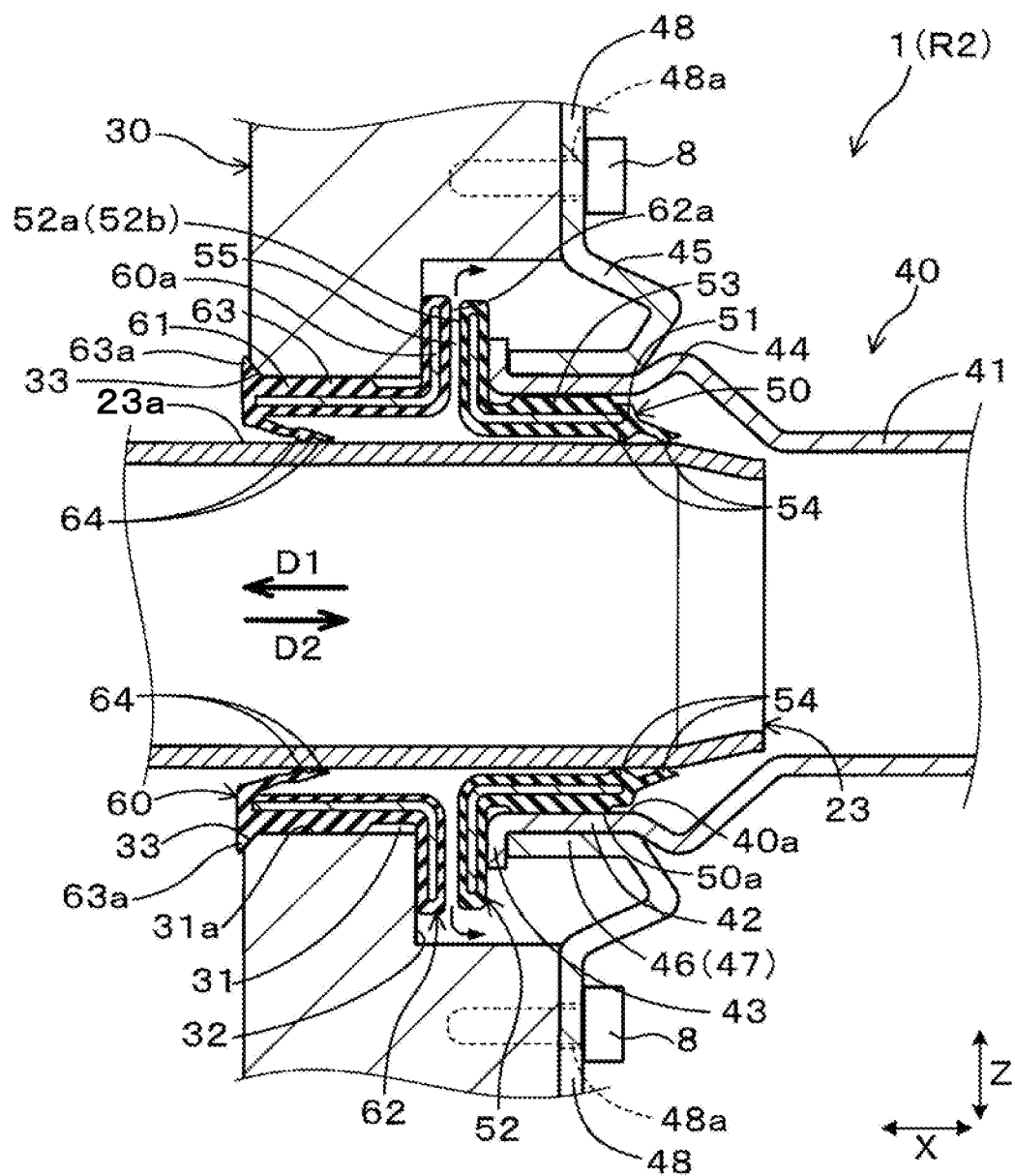
FIG. 6 shows a cross-sectional view of a second region in FIG. 1.

As shown in FIG. 6, like the inlet pipe 22, the discharge pipe 23, which is the refrigerant flow pipe, is inserted in the through-hole 31 formed through the case 30, and the distal end section projects to the outside of the case 30. The discharge pipe 23 is configured to be connected to the connector 40 that is the same as the one used in the case of the inlet pipe 22 on the outside of the case 30 (refer to the second region R2 in FIG. 1). The sealing member 50, which is the same as the one used in the case of the inlet pipe 22, seals between the discharge pipe 23 and the connector 40.

The connector 40 is configured such that the tubular pipe portion 41 communicates with the discharge pipe 23. The inner tube 42 of the pipe portion 41 has an inner diameter greater than the outer diameter of the discharge pipe 23. The distal end section of the discharge pipe 23 is inserted inside the inner tube 42. The other one of the external pipes E (not shown, refer to FIG. 1) that is to communicate with the discharge pipe 23 is connected to the pipe portion 41.

The sealing member 50 and the sealing member 60 are the same as those used in the case of the inlet pipe 22, and only the differences will be described.

The tubular portion 51 of the sealing member 50 is located between the inner peripheral surface 40a of the connector 40 and an outer peripheral surface 23a of the discharge pipe 23. the projection 53 of the sealing member 50 projects radially outward from the tubular portion 51 toward the inner peripheral surface 40a of the connector 40, and the projections 54 of the sealing member 50 project radially inward from the tubular portion 51 toward the outer peripheral surface 23a of the discharge pipe 23.

The tubular portion 61 of the sealing member 60 is located between the inner peripheral surface 31a of the through-hole 31 of the case 30 and the outer peripheral surface 23a of the discharge pipe 23. The projection 63 of the sealing member 60 projects radially outward from the tubular portion 61 toward the inner peripheral surface 31a of the through-hole 31 of the case 30, and the projections 64 of the sealing member 60 project radially inward from the tubular portion 61 toward the outer peripheral surface 23a of the inlet pipe 23.

The gap 55 formed between the sealing member 50 and the sealing member 60 forms a refrigerant discharging passage that connects the space on the outer peripheral surface 23a of the discharge pipe 23 to the outside of the case 30. The gap 55 functions to discharge the refrigerant to the outside of the case 30 when the refrigerant flows into the space on the outer peripheral surface 23a of the discharge pipe 23.

Next, the operation for connecting the connector 40 to the inlet pipe 22, which projects from the case 30, will be described with reference to FIG. 7. This operation is the same as the operation for connecting the connector 40 to the discharge pipe 23, which projects from the case 30. Thus, only the operation regarding the inlet pipe 22 will be described, and the operation regarding the discharge pipe 23 will be omitted.

Figure 7:
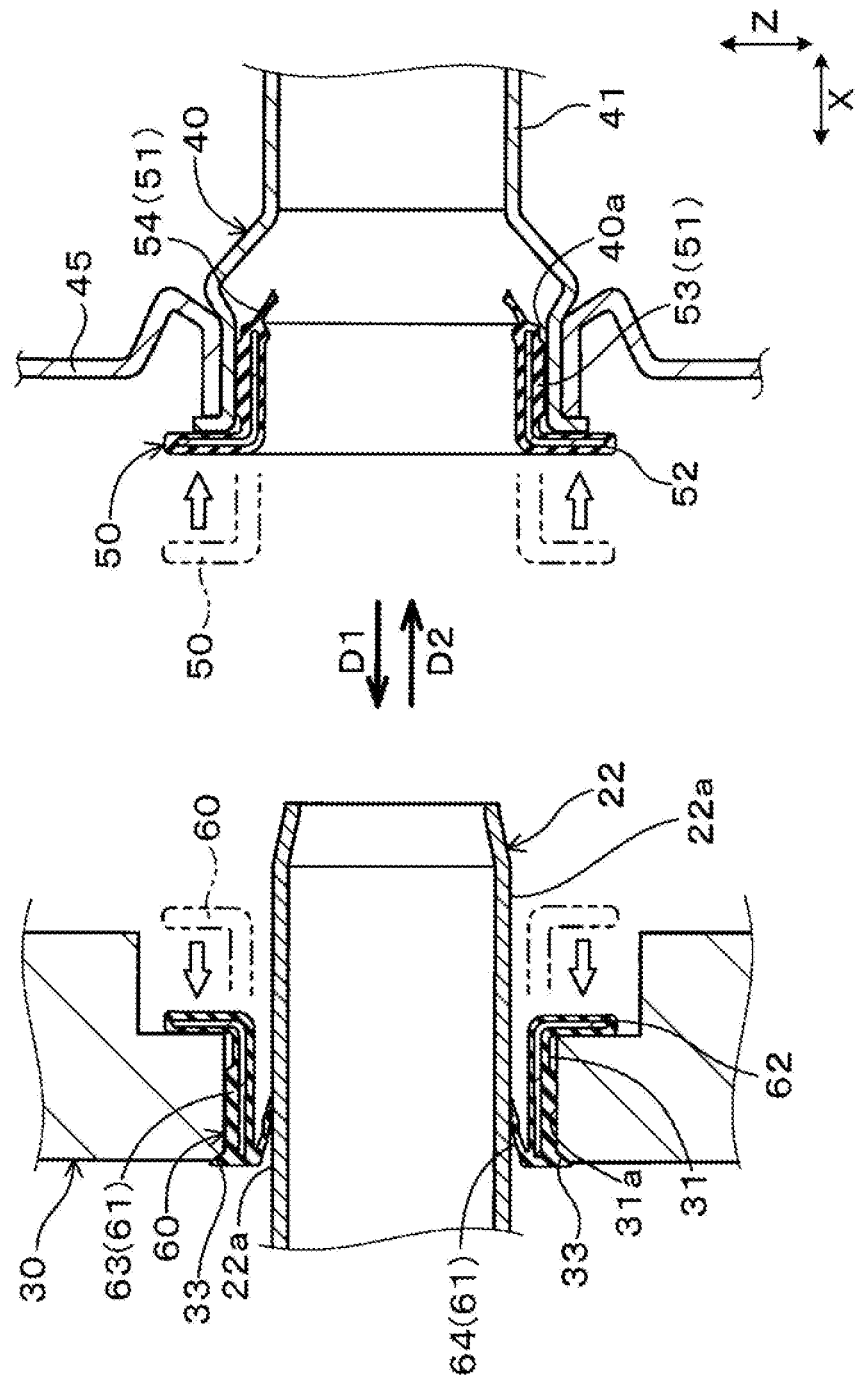
FIG. 7 shows a schematic diagram how a connector and a sealing member are assembled.

As shown in FIG. 7, before connecting the connector 40 to the inlet pipe 22, which projects from the case 30, the sealing member 50 is previously mounted on the connector 40, and the sealing member 60 is previously mounted on the case 30.

The sealing member 50 is mounted on the connector 40 by pushing the tubular portion 51 that has been inserted in the connector 40 in the insertion direction D2 until the flange portion 52 abuts against the connector 40. At this time, the projection 53 of the sealing member 50 slides along the inner peripheral surface 40a of the connector 40.

The sealing member 60 is fitted to the inlet pipe 22, and then the tubular portion 61 is inserted in the through-hole 31 of the case 30. The tubular portion 61 that has been inserted in the through-hole 31 is pushed in the insertion direction D1 until the flange portion 62 abuts against the case 30. In this manner, the sealing member 60 is mounted on the case 30. At this time, the projection 63 of the sealing member 60 slides along the inner peripheral surface 31a of the through-hole 31 of the case 30, and the projections 64 of the sealing member 60 slide along the outer peripheral surface 22a of the inlet pipe 22.

At this time, when the sealing member 60 is pushed in the insertion direction D1, the hook 63a, which protrudes radially outward from the projection 63, is caught on the locking portion 33. Thus, the sealing member 60 is locked to the case 30. At this time, when the hook 63a of the projection 63 is caught on the locking portion 33 of the case 30, the locking portion 33 functions as a second sealing member restricting section, which restricts the movement of the sealing member 60 in the removing direction D2. Since the locking portion 33 is chamfered, it is advantageous in preventing damage on the sealing member 60.

After that, the case 30 and the connector 40 are brought close to each other, and the inlet pipe 22 is inserted in the tubular portion 51 of the sealing member 50. At this time, the projections 54 of the sealing member 50 slide along the outer peripheral surface 22a of the inlet pipe 22. The connector 40 is then fastened to the case 30 with the fastening members 8 inserted in the mounting holes 48a of the flange portion 45 (refer to FIG. 5).

Figure 8:
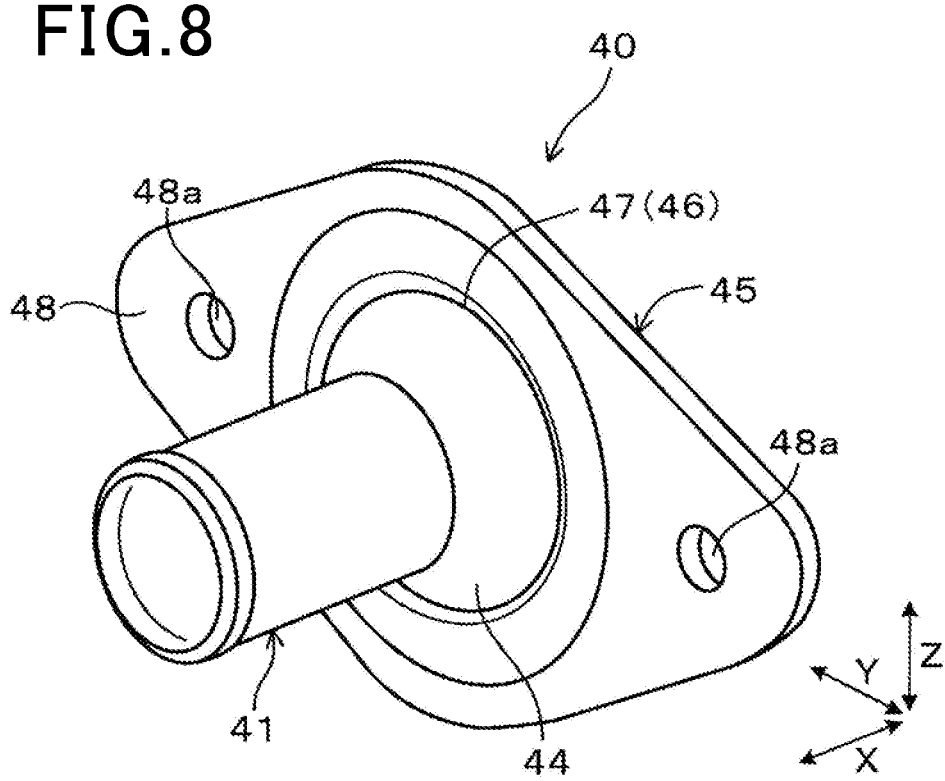
FIG. 8 shows a perspective view of the connector of the power conversion device according to the first embodiment as viewed from a pipe portion.

As shown in FIG. 8, the connector 40 includes the pipe portion 41 and the flange portion 45 joined to each other in a state in which the pipe portion 41 is inserted in the insertion hole 47 of the flange portion 45.

Figure 9:
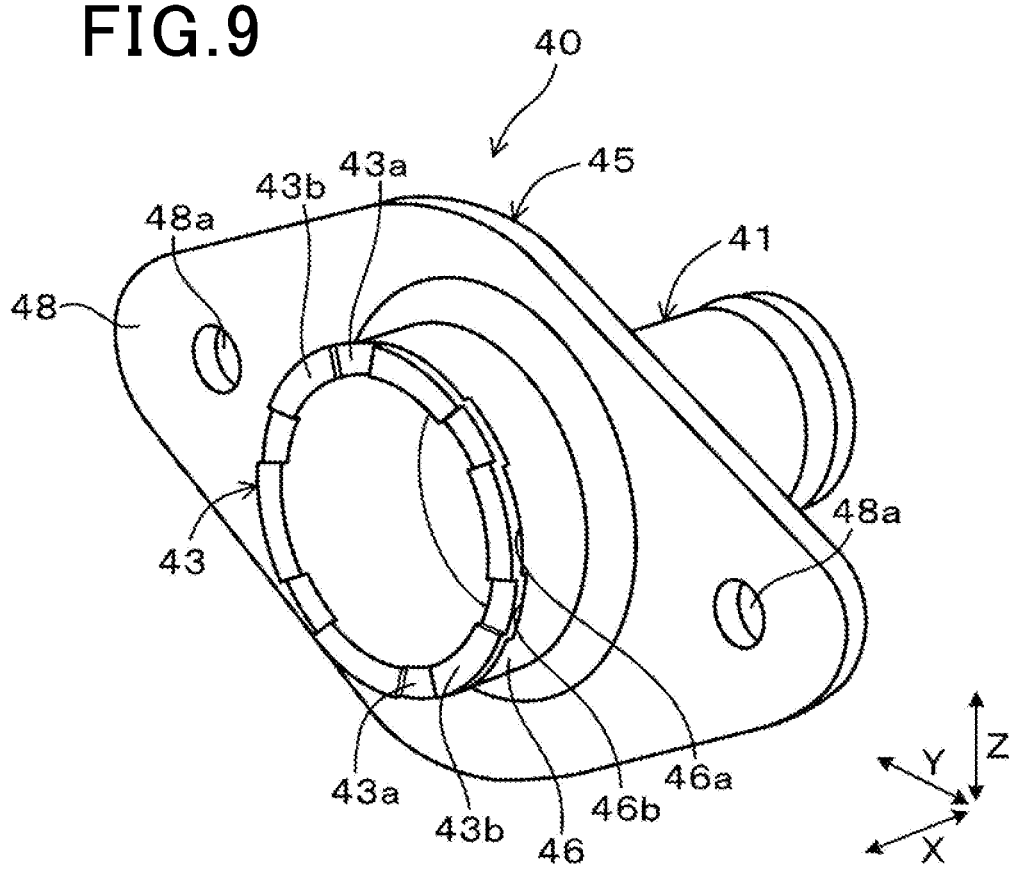
FIG. 9 shows a perspective view of the connector of FIG. 8 as viewed from the backside of a flange portion.

As shown in FIG. 9, the projection 43 of the pipe portion 41 is configured such that the annular end face extending in the circumferential direction forms a surface with projections and recesses (surface with steps) in the first direction X. The surface with projections and recesses is formed by alternately placing engaging projections 43a and engaging recesses 43b in the circumferential direction with respect to the outer tube 46 of the flange portion 45.

Like the pipe portion 41, the outer tube 46 of the flange portion 45 is configured in such a manner that the annular end face extending in the circumferential direction forms a surface with projections and recesses (surface with steps) in the first direction X. The surface with projections and recesses is formed by alternately placing engaging projections 46a and engaging recesses 46b in the circumferential direction with respect to the projection 43 of the pipe portion 41.

The connector 40 has a fitting structure in which the engaging projections 43a of the pipe portion 41 are fitted in the engaging recesses 46b of the flange portion 45, and the engaging projections 46a of the flange portion 45 are fitted in the engaging recesses 43b of the pipe portion 41. The fitting structure functions as a circumferential direction restricting section, which restricts the pipe portion 41 and the flange portion 45 from relatively moving in the circumferential direction of the pipe portion.

The fitting structure includes the engaging projections 43a and the engaging recesses 43b, which are a first engaging portion on the pipe portion 41, and the engaging recesses 46b and the engaging projections 46a, which are a second engaging portion on the flange portion 45 engaged with the engaging projections 43a and the engaging recesses 43b of the pipe portion 41.

The number of the engaging projections 43a, the engaging recesses 43b, the engaging projections 46a, and the engaging recesses 46b of the fitting structure can be changed as required.

In the present embodiment, the above-mentioned fitting structure of the connector 40 is formed by crimping, which is one of deformation processes. The crimping will be described with reference to FIGS. 10 to 15.

Figure 10:
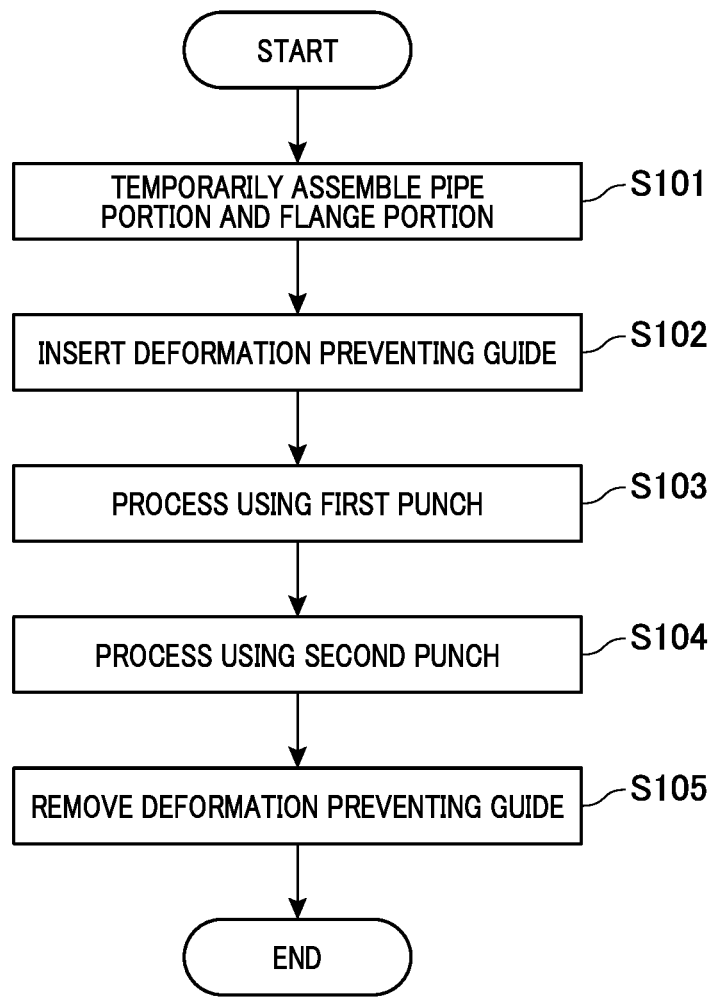
FIG. 10 shows a flowchart of a crimping operation of the connector of FIG. 8.
Figure 11:
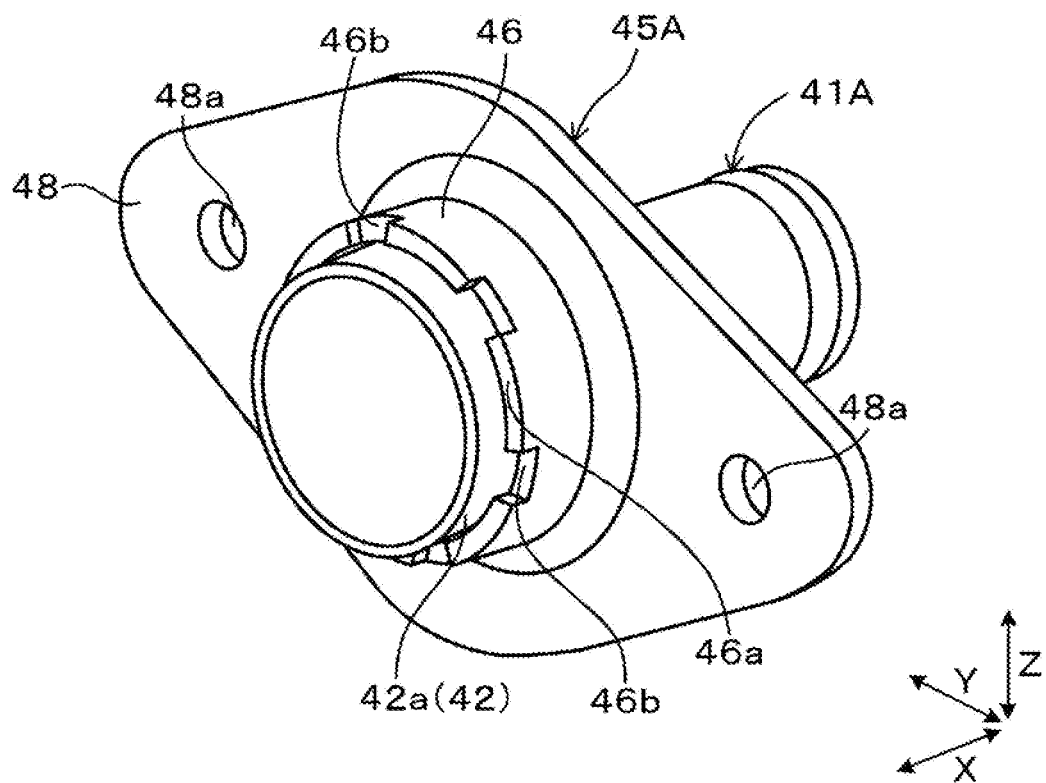
FIG. 11 shows a perspective view of the pipe portion and the flange portion, which are temporarily assembled in the first step of FIG. 10.

As shown in FIG. 10, the crimping of the connector 40 is achieved by sequentially executing the operations from the first step S101 to the fifth step S105. Note that, one or more steps may be added to the flowchart, each step may be divided into multiple steps, or multiple steps may be combined as required.

The first step S101 of FIG. 10 is a step for temporarily assembling a pipe portion 41A and a flange portion 45A before being crimped. The outer tube 46 of the flange portion 45A includes the engaging projections 46a and the engaging recesses 46b, which are alternately formed in the circumferential direction in advance. The pipe portion 41A is inserted in the insertion hole 47, which is the space inside the outer tube 46 (refer to FIG. 11). When the projection 44 of the pipe portion 41A (refer to FIGS. 5 and 6) abuts against the outer tube 46 of the flange portion 45A, the position of the pipe portion 41A is determined with respect to the flange portion 45A in a state in which one end 42a of the inner tube 42 is exposed from the outer tube 46.

Figure 12:
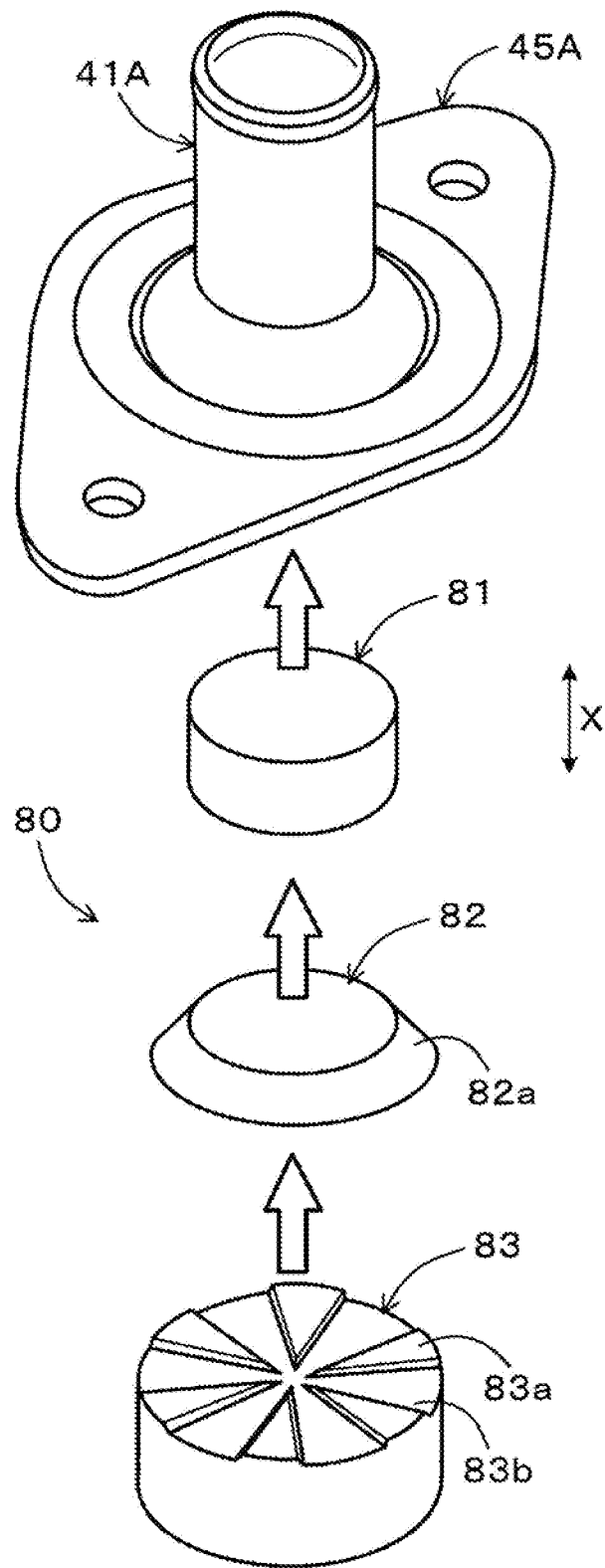
FIG. 12 shows a perspective view of a crimping jig used in the joining operation of FIG. 10.

As shown in FIG. 12, a crimping jig 80 is used in crimping the pipe portion 41A and the flange portion 45A. The crimping jig 80 includes a deformation preventing guide 81, a first punch 82, a second punch 83, and a load receiver 84 (refer to FIG. 13).

The deformation preventing guide 81 prevents the deformation of the inner tube 42 of the pipe portion 41A during crimping. The deformation preventing guide 81 is configured as a columnar member having an outer diameter that is the same as the inner diameter of the inner tube 42 of the pipe portion 41A.

The first punch 82 performs the initial stage process of pressing the end 42a of the inner tube 42 of the pipe portion 41A to deform the end 42a into the projection 43. The first punch 82 is configured as a circular truncated cone member including a tapered pressing surface 82a.

The second punch 83 is used after using the first punch 82. The second punch 83 performs the final stage process of pressing the end 42a of the inner tube 42 of the pipe portion 41A to deform the end 42a into the projection 43. The second punch 83 includes a pressing surface that presses the end 42a of the inner tube 42 of the pipe portion 41A. The pressing surface is circular in a planar view. The pressing surface is formed of projecting surfaces 83a and recessed surfaces 83b that are alternately arranged in the circumferential direction.

The load receiver 84 is for receiving the pressing load applied from the first punch 82 and the second punch 83.

Figure 13:
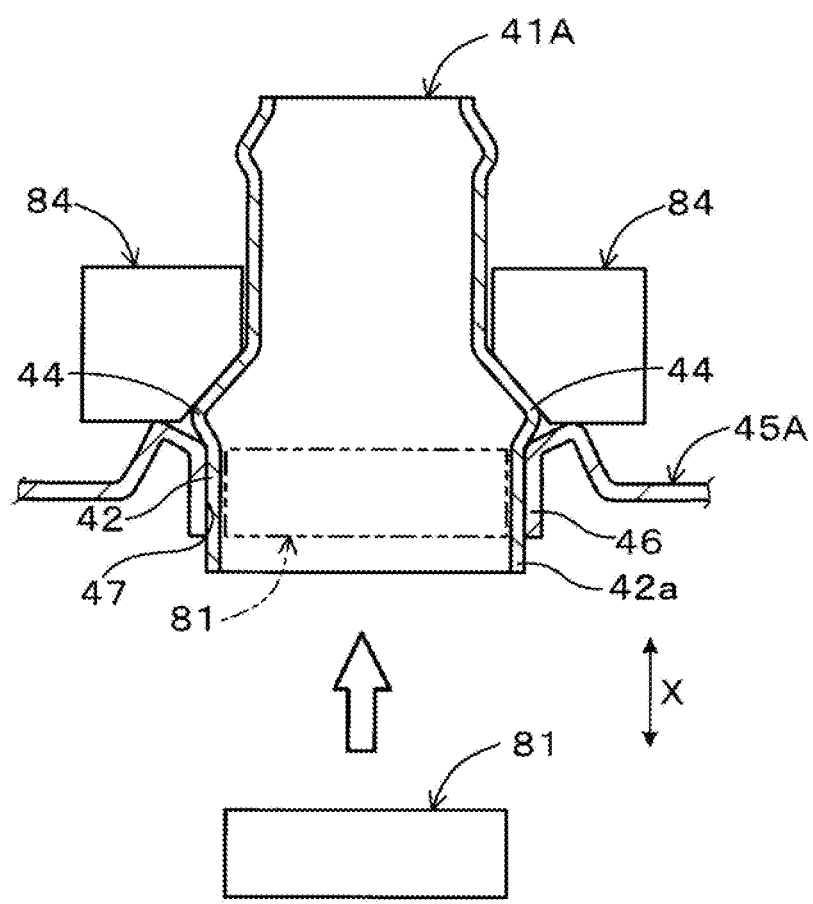
FIG. 13 shows a schematic view illustrating the manner of the second step in FIG. 10.

The second step S102 of FIG. 10 is a step for inserting, after the first step S101, the deformation preventing guide 81 into the inner tube 42 of the pipe portion 41A. In the second step S102, with the pipe portion 41A and the flange portion 45A set to the load receiver 84, the deformation preventing guide 81 is inserted in the inner tube 42 of the pipe portion 41A as shown in FIG. 13.

Figure 14:
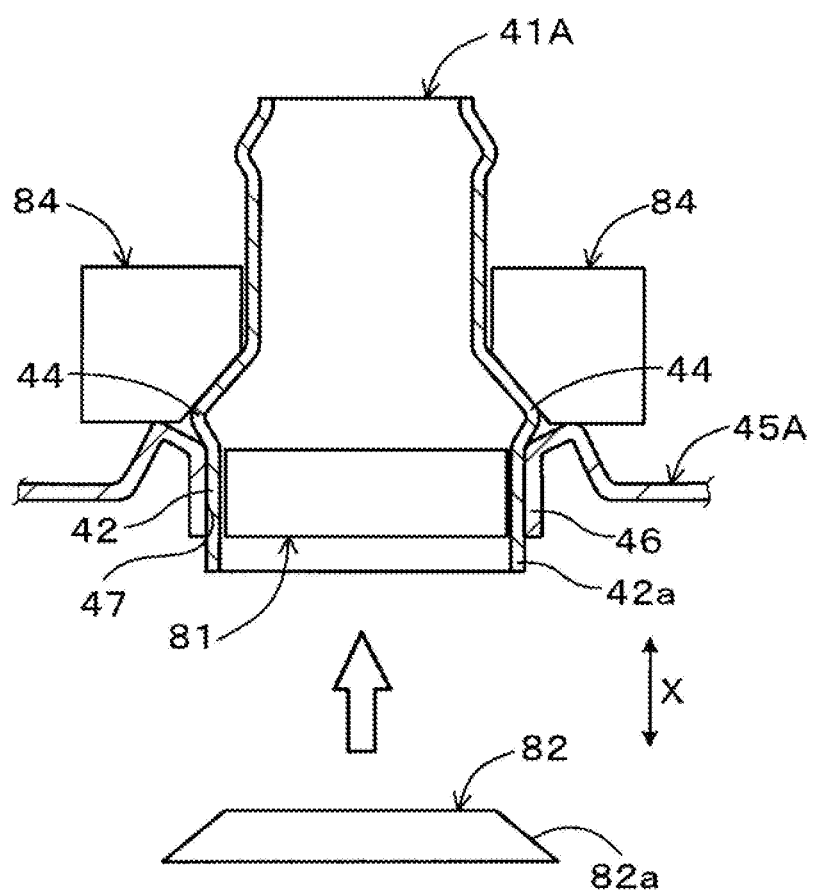
FIG. 14 shows a schematic view illustrating the manner of the third step in FIG. 10.

The third step S103 of FIG. 10 is a step for performing the process with the first punch 82 after the second step S102. In the third step S103, as shown in FIG. 14, the end 42a of the inner tube 42 of the pipe portion 41A is pressed using the pressing surface 82a of the first punch 82 and is widened radially outward.

Figure 15:
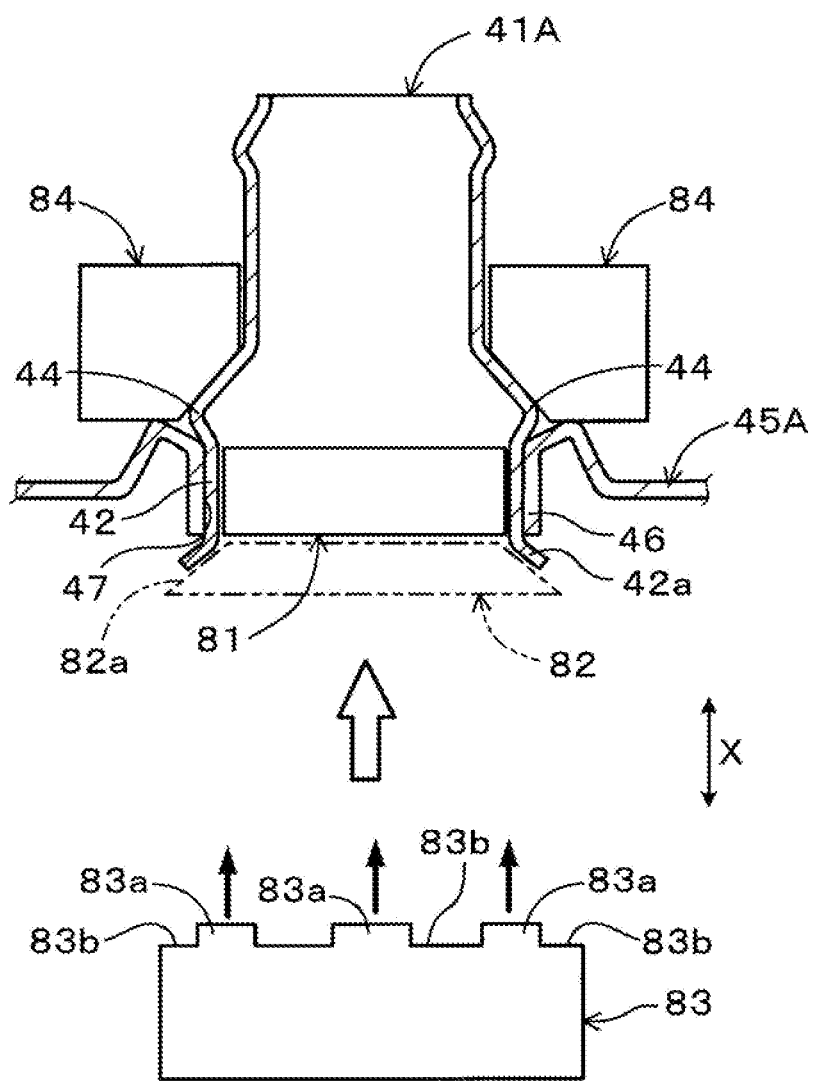
FIG. 15 shows a schematic view illustrating the manner of the fourth step in FIG. 10.

The fourth step S104 of FIG. 10 is a step for performing the process with the second punch 83 subsequent to the third step S103. In the fourth step S104, as shown in FIG. 15, the end 42a of the inner tube 42 of the pipe portion 41A is pressed using the pressing surface of the second punch 83 and is further widened radially outward. At this time, the projecting surfaces 83a and the recessed surfaces 83b, which form the pressing surface of the second punch 83, plastically deform the end 42a of the inner tube 42 of the pipe portion 41A together with the outer tube 46 of the flange portion 45A.

Accordingly, as shown in FIG. 9, the projecting surfaces 83a of the second punch 83 form the engaging projections 43a of the projection 43 on the end 42a of the inner tube 42, and the engaging projections 43a are fitted to the engaging recesses 46b of the outer tube 46. Also, the recessed surfaces 83b of the second punch 83 presses the engaging recesses 43b of the projection 43. The engaging recesses 43b are fitted to the engaging projections 46a of the outer tube 46. As a result, the connector 40 is formed in which the pipe portion 41 and the flange portion 45 are joined to each other by crimping.

The fifth step S105 of FIG. 10 is a step for removing the deformation preventing guide 81 from the connector 40 after the fourth step S104.

Next, the operational advantages of the above-described first embodiment will be described.

In the above-mentioned power conversion device 1, the cooling pipes 21, which are the heat exchanger of the cooling device 20, are capable of exchanging heat with the semiconductor modules 10, which include the switching elements 11. The connectors 40 are connected to the inlet pipe 22 and the discharge pipe 23 of the cooling device 20 outside the case 30. Each connector 40 is located between the inlet pipe 22 or the discharge pipe 23 of the cooling device 20 and the external pipe E. When the connector 40 is connected to the inlet pipe 22 or the discharge pipe 23, the sealing member 50 seals between the inlet pipe 22 or the discharge pipe 23 and the connector 40.

The connector 40 is configured such that the pipe portion 41 and the flange portion 45 are joined to each other by crimping in a state in which the pipe portion 41, which is a separate member from the flange portion 45, is inserted in the insertion hole 47 of the flange portion 45.

Thus, while the flange portion 45 is used in common by the external pipes E having different shapes, the versatility in connecting to the external pipes E of a variety of shapes is improved by changing only the shape of the pipe portion 41, which is a separate member from the flange portion 45.

Since only the shape of the pipe portion 41 needs to be changed, for example, the number of molds for forming the flange portion 45 does not need to be increased, which minimizes the costs required for producing the connector 40.

The changing of the shape of the pipe portion 41 includes employing a bent pipe that is bent at a given angle or an odd-shaped pipe formed by connecting pipes with different shapes instead of the straight pipe extending linearly as shown in FIG. 8.

As described above, the above-described first embodiment 1 provides the power conversion device 1 that includes the highly versatile and low-cost connector 40 located between the inlet pipe 22 or the discharge pipe 23, which are the refrigerant flow pipe of the cooling device 20 for the semiconductor modules 10, and the external pipe E.

According to the connector 40 of the above-mentioned power conversion device 1, the projection 43 and the projection 44 of the pipe portion 41 sandwich the outer tube 46 of the flange portion 45, so that the pipe portion 41 and the flange portion 45 are restricted from relatively moving in the first direction X, which is the axial direction.

According to the connector 40 of the above-mentioned power conversion device 1, the engaging projections 43a and the engaging recesses 43b provided on the projection 43 of the pipe portion 41 are fitted to the engaging projections 46a and the engaging recesses 46b provided on the outer tube 46 of the flange portion 45, so that the pipe portion 41 and the flange portion 45 are restricted from relatively moving in the circumferential direction.

In particular, the projection 43 of the pipe portion 41 functions to restrict the relative movement of the pipe portion 41 and the flange portion 45 in the axial direction and to restrict the relative movement of the pipe portion 41 and the flange portion 45 in the circumferential direction.

According to the connector 40 of the above-mentioned power conversion device 1, the pipe portion 41 and the flange portion 45 are joined as one unit by crimping. This reduces the cost that is otherwise required for the molds in molding and allows the pipe portion 41 and the flange portion 45 to be joined at a low cost.

As a modification related to the above-described first embodiment in particular, the axial direction restricting section for restricting the relative movement of the pipe portion 41 and the flange portion 45 in the axial direction may be formed on one of the projection 43 and the projection 44 or may be formed by a section other than the projection 43 and the projection 44.

Hereinafter, other embodiments related to the above-mentioned first embodiment will be described with reference to the drawings. In other embodiments, the same reference numerals are given to those components that are the same as the corresponding components of the first embodiment, and detailed explanations of the same components are omitted.

Second Embodiment

Figure 16:
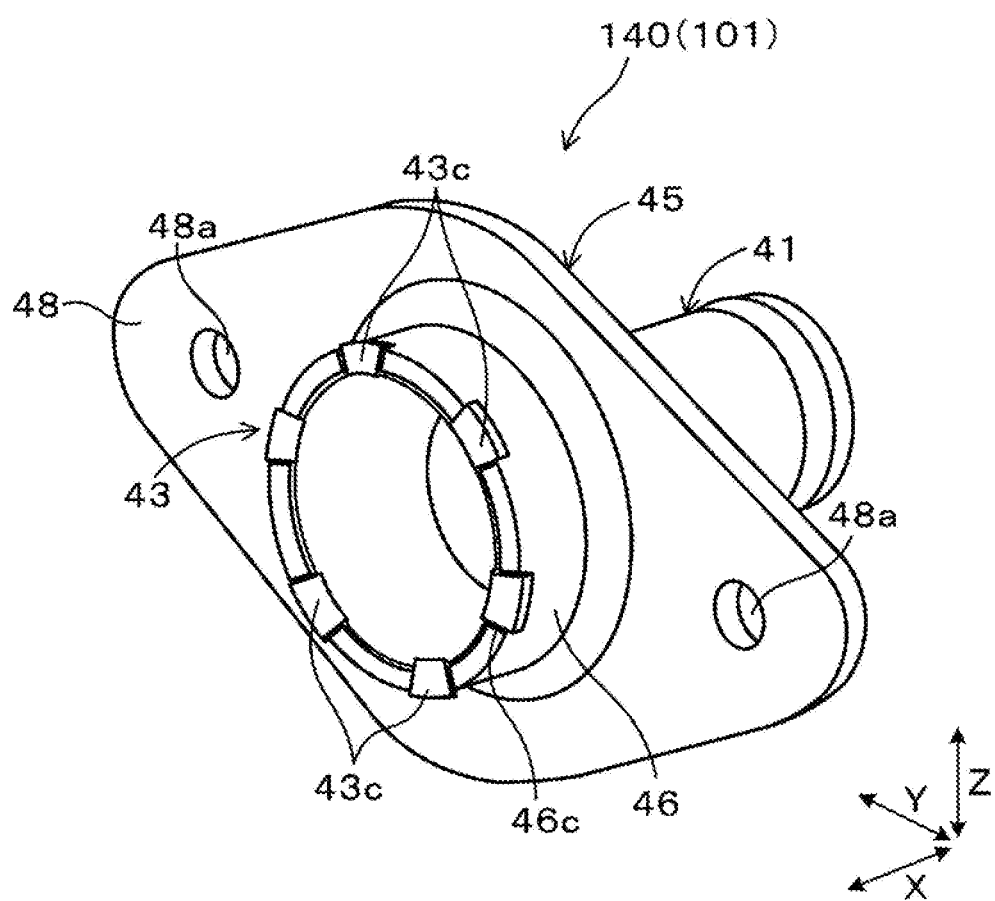
FIG. 16 shows a perspective view of a connector of a power conversion device according to a second embodiment corresponding to FIG. 9.

As shown in FIG. 16, a power conversion device 101 according to a second embodiment differs from that of the first embodiment in the structure of a connector 140.

Others are the same as the first embodiment.

Figure 17:
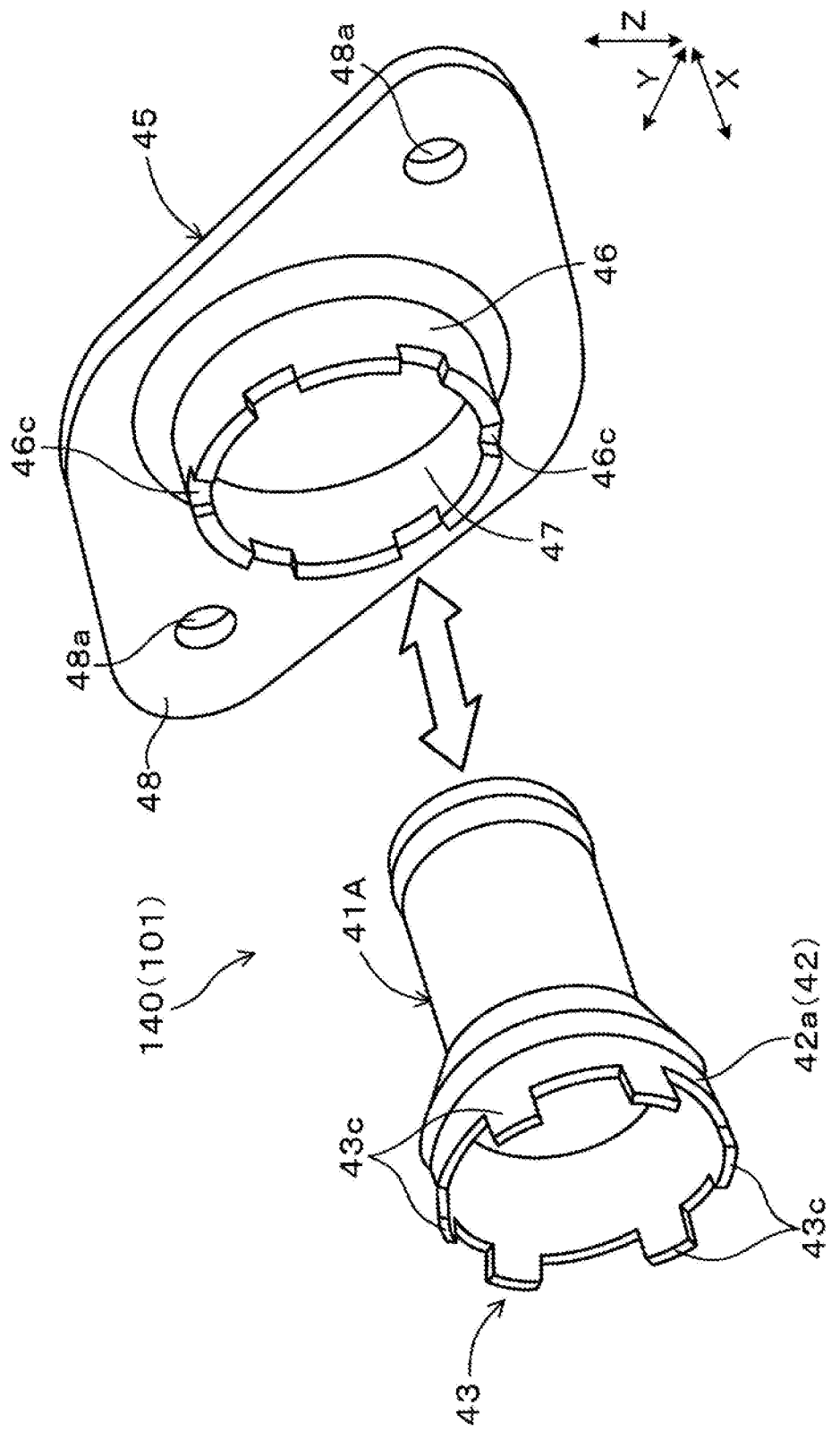
FIG. 17 shows an exploded perspective view of the connector of FIG. 16.

As shown in FIG. 17, in the connector 140, the projection 43 of the pipe portion 41A is constituted by engaging pieces 43c that project from the end 42a of the inner tube 42 in the first direction X and are arranged in the circumferential direction at substantially equal intervals. With the inner tube 42 inserted in the insertion hole 47 of the outer tube 46, the engaging pieces 43c are bent radially outward using a bending process, which is a deformation process, so that the pipe portion 41A turns into the pipe portion 41 (refer to FIG. 16).

Additionally, in the connector 140, engaging grooves 46c are provided at substantially equal intervals in the circumferential direction on the annular end face of the outer tube 46 of the flange portion 45. The engaging grooves 46c are formed by a deformation process such as pressing, notching, and bending.

As shown in FIG. 16, the engaging pieces 43c of the pipe portion 41 that are bent radially outward are fitted to the engaging grooves 46c of the flange portion 45, respectively, so that the connector 140 is formed.

In this manner, the connector 140 has the fitting structure in which the engaging pieces 43c of the pipe portion 41 are fitted to the engaging grooves 46c of the flange portion 45. The fitting structure functions as the circumferential direction restricting section, which restricts the pipe portion 41 and the flange portion 45 from relatively moving in the circumferential direction of the pipe portion.

Note that, in this fitting structure, the number of the engaging pieces 43c and the engaging grooves 46c may be changed as required.

According to the connector 140 of the power conversion device 101 of the second embodiment, the pipe portion 41 and the flange portion 45 are joined as one unit by the deformation process other than crimping.

Additionally, the same operational advantages as the first embodiment are achieved.

Although the present disclosure has been described in accordance with the embodiments, it is understood that the present disclosure is not limited to the embodiments and the configurations. The present disclosure embraces various modifications and modifications that come within the range of equivalency. Additionally, various combinations and forms, or other combinations and forms including only one or more additional elements, or less than all elements are included in the scope and ideas obtainable from the present disclosure.

The above-described embodiments exemplify the case in which the connector 40, 140 is connected to each of the inlet pipe 22 and the discharge pipe 23 of the cooling device 20. Instead, the connector 40, 140 may be connected to one of the inlet pipe 22 and the discharge pipe 23, and a connector having a different structure from the connector 40, 140 may be connected to the other one of the inlet pipe 22 and the discharge pipe 23.

The above-described embodiments exemplify the case in which the connector 40, 140 made of a metal material is employed. Instead, the connector 40, 140 made of a material other than the metal material such as a plastic material may be employed.

The above-described embodiments exemplify the case in which the axial direction restricting section and the circumferential direction restricting section are both provided on the connector 40, 140. Instead, a structure in which at least one of the axial direction restricting section and the circumferential direction restricting section of the connector 40, 140 is omitted may be employed.

The above-described embodiments exemplify the stack-type cooling device 20, which cools the semiconductor modules 10. However, the structure of the cooling device is not limited to the stack type, and a cooling device having a different structure may be employed as required as long as the cooling device 20 includes the heat exchanger that is capable of exchanging heat with the semiconductor modules, the inlet pipe that introduces a refrigerant to the heat exchanger, and the discharge pipe that discharges the refrigerant from the heat exchanger.

What is claimed is:

1. A power conversion device comprising:
a semiconductor module including a switching element;
a cooling device including a heat exchanger capable of exchanging heat with the semiconductor module, an inlet pipe that introduces a refrigerant to the heat exchanger, and a discharge pipe that discharges the refrigerant from the heat exchanger;
a case that accommodates the semiconductor module and the cooling device;
a connector connected to a refrigerant flow pipe, which is at least one of the inlet pipe and the discharge pipe of the cooling device; and
a sealing member that seals between the refrigerant flow pipe and the connector, wherein
the connector includes a pipe portion, which communicates with the refrigerant flow pipe, and a flange portion, which is secured to the case, and the pipe portion and the flange portion are joined to each other with the pipe portion located in an insertion hole of the flange portion,
the connector includes an axial direction restricting section that restricts the pipe portion and the flange portion from relatively moving in an axial direction of the pipe portion, and
the axial direction restricting section includes a first projection and a second projection that each project radially outward on the pipe portion, and the first and second projections are each located adjacent to an opening edge portion of the insertion hole of the flange portion so that the opening edge portion is located between the first and second projections in the axial direction.

2. The power conversion device according to claim 1, wherein
the connector includes a circumferential direction restricting section that restricts the pipe portion and the flange portion from relatively moving in a circumferential direction of the pipe portion.

3. The power conversion device according to claim 2, wherein
the circumferential direction restricting section includes a first engaging portion that is located on the pipe portion and a second engaging portion that is located on the flange portion and is engaged with the first engaging portion on the pipe portion.

4. A The power conversion device according to claim 1, wherein:
the pipe portion and the flange portion of the connector are both made of a metal material and are joined to each other by a deformation process.

5. The power conversion device according to claim 4, wherein
the pipe portion and the flange portion are joined to each other by crimping, which is the deformation process.

6. A power conversion device comprising:
a semiconductor module including a switching element;
a cooling device including a heat exchanger capable of exchanging heat with the semiconductor module, an inlet pipe that introduces a refrigerant to the heat exchanger, and a discharge pipe that discharges the refrigerant from the heat exchanger;
a case that accommodates the semiconductor module and the cooling device;
a connector connected to a refrigerant flow pipe, which is at least one of the inlet pipe and the discharge pipe of the cooling device; and
a sealing member that seals between the refrigerant flow pipe and the connector, the sealing member comprising (i) a tubular portion between the refrigerant flow pipe and the connector and (ii) a disk-like flange portion that extends radially outward from the tubular portion, wherein
the connector includes a pipe portion, which communicates with the refrigerant flow pipe, and a flange portion, which is secured to the case, and the pipe portion and the flange portion are joined to each other with the pipe portion located in an insertion hole of the flange portion,
the connector includes an axial direction restricting section that restricts the pipe portion and the flange portion from relatively moving in an axial direction of the pipe portion, and
the axial direction restricting section includes at least one projection that projects radially outward on the pipe portion, and the at least one projection is located adjacent to an opening edge portion of the insertion hole of the flange portion.

7. The power conversion device according to claim 6, wherein
the connector includes a circumferential direction restricting section that restricts the pipe portion and the flange portion from relatively moving in a circumferential direction of the pipe portion.

8. The power conversion device according to claim 7, wherein
the circumferential direction restricting section includes a first engaging portion that is located on the pipe portion and a second engaging portion that is located on the flange portion and is engaged with the first engaging portion on the pipe portion.

9. A power conversion device comprising:
a semiconductor module including a switching element;
a cooling device including a heat exchanger capable of exchanging heat with the semiconductor module, an inlet pipe that introduces a refrigerant to the heat exchanger, and a discharge pipe that discharges the refrigerant from the heat exchanger;
a case that accommodates the semiconductor module and the cooling device;
a connector connected to a refrigerant flow pipe, which is at least one of the inlet pipe and the discharge pipe of the cooling device; and
a sealing member that seals between the refrigerant flow pipe and the connector, the sealing member comprising (i) a tubular portion between the refrigerant flow pipe and the connector and (ii) a disk-like flange portion that extends radially outward from the tubular portion, wherein
the connector includes a pipe portion, which communicates with the refrigerant flow pipe, and a flange portion, which is secured to the case, and the pipe portion and the flange portion are joined to each other with the pipe portion located in an insertion hole of the flange portion, and
the pipe portion and the flange portion of the connector are both made of a metal material and are joined to each other by a deformation process.

10. The power conversion device according to claim 9, wherein
the pipe portion and the flange portion are joined to each other by crimping, which is the deformation process.

* * * * *